United States Patent
Vergis et al.

(10) Patent No.: US 10,276,219 B2
(45) Date of Patent: Apr. 30, 2019

(54) SYSTEM FOR IMPROVED POWER DISTRIBUTION TO A MEMORY CARD THROUGH REMOTE SENSE FEEDBACK

(71) Applicant: Intel Corporation, Santa Clara, CA (US)

(72) Inventors: George Vergis, Portland, OR (US); Dat Le, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/718,388

(22) Filed: Sep. 28, 2017

(65) Prior Publication Data

US 2018/0247678 A1    Aug. 30, 2018

Related U.S. Application Data

(60) Provisional application No. 62/462,944, filed on Feb. 24, 2017.

(51) Int. Cl.
| | |
|---|---|
| G11C 5/14 | (2006.01) |
| G11C 5/04 | (2006.01) |
| G11C 5/06 | (2006.01) |
| G11C 7/10 | (2006.01) |

(52) U.S. Cl.
CPC ............... *G11C 5/147* (2013.01); *G11C 5/04* (2013.01); *G11C 5/063* (2013.01); *G11C 5/14* (2013.01); *G11C 7/1063* (2013.01); *G11C 2207/10* (2013.01); *G11C 2207/105* (2013.01)

(58) Field of Classification Search
CPC .................................................... G11C 5/147
USPC ....................................... 365/189.09, 189.07
See application file for complete search history.

(56) References Cited

U.S. PATENT DOCUMENTS 9,298,228 B1 *   3/2016   Abhyankar ............ G06F 1/185

\* cited by examiner

*Primary Examiner* — Jason Lappas
(74) *Attorney, Agent, or Firm* — Alliance IP, LLC

(57) ABSTRACT

In one embodiment, an apparatus comprises a first connector to couple to a connector of a memory card, the memory card comprising a first sense node to sense a supply voltage at a first location of the memory card, the first connector comprising a voltage supply pin; a ground pin; and a sense pin to couple to the first sense node; a first sense line to couple to the first sense node through the sense pin; and a voltage regulator coupled to the first sense line, the voltage regulator to provide the supply voltage based on feedback received from the first sense node of the memory card via the first sense line.

13 Claims, 7 Drawing Sheets

SYSTEM FOR IMPROVED POWER DISTRIBUTION TO A MEMORY CARD THROUGH REMOTE SENSE FEEDBACK

RELATED APPLICATION

This application claims benefit under 35 U.S.C. § 119(e) of U.S. Provisional Application Ser. No. 62/462,944, entitled "SYSTEM FOR IMPROVED POWER DISTRIBUTION THROUGH DIMM VOLTAGE SENSE FEEDBACK" filed Feb. 24, 2017.

FIELD

The present disclosure relates in general to the field of computer development, and more specifically, to power distribution.

BACKGROUND

A computer system may include one or more central processing units (CPUs) that may be coupled to one or more memory devices. A CPU may include a processor to execute an operating system or other software applications that utilize the memory devices coupled to the CPU.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
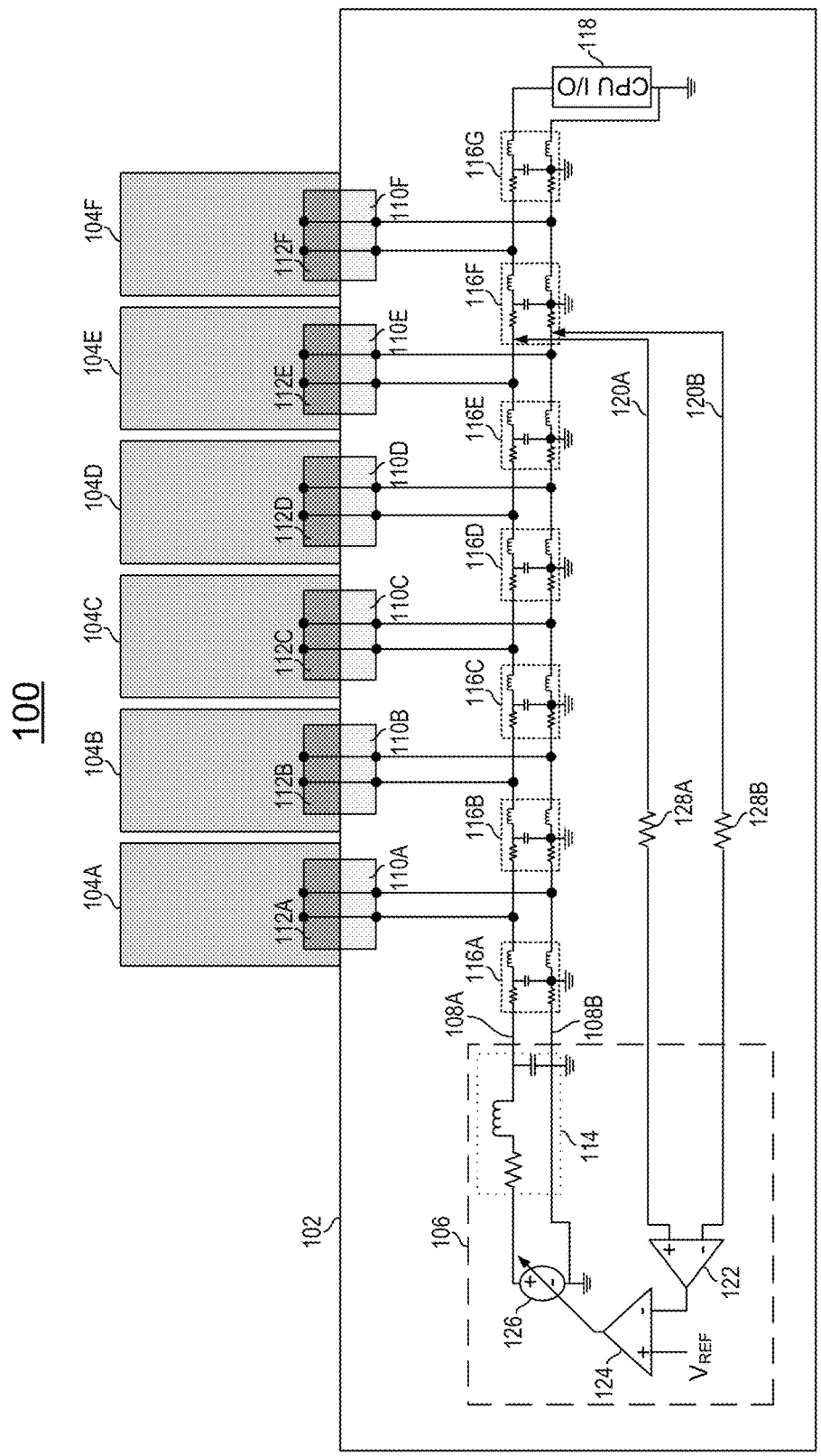
FIG. 1 depicts an example computing system with sense nodes on a circuit board for supply voltage feedback in accordance with various embodiments.

FIG. 1 depicts an example computing system 100 comprising a circuit board 102 coupled to a plurality of memory cards 104 (i.e., 104A-104F), such as dual in-line memory modules (DIMMs). Circuit board 102 is also coupled to a voltage regulator 106 to provide a supply voltage to various components coupled to the circuit board. A positive terminal of voltage regulator 106 is coupled to trace 108A and a negative terminal of voltage regulator 106 is coupled to trace 108B. Trace 108A is also coupled to each board connector 110 (e.g., 110A-110F). A board connector may be, for example, a socket or other electromechanical connector on circuit board 102. Trace 108B is also coupled to each board connector 110. Each memory card 104 may include a respective card connector 112 (e.g., 112A-112F) that is configured to mate with a corresponding board connector 110, such that electrically conductive pins of the card connector 112 are made to contact electrically conductive pins of board connector 110. Voltage regulator 106 may provide a differential supply voltage to each memory card 104. In various embodiments, the supply voltage may also be provided to other components resident on the circuit board 102, such as central processing unit (CPU) input/output (I/O) circuitry 118 (which may include I/O circuitry for a CPU memory controller that communicates with the memory cards 104).

The differential supply voltage output by voltage regulator 106 may be subject to various parasitic elements. For example, the output of voltage regulator 106 may be subject to parasitic elements 114, which may represent parasitic resistance, inductance, and/or capacitance, rather than discrete components. Similarly, segments of trace 108A and 108B may be subject to parasitic elements 116 (e.g., 116A-116G). The parasitic elements 114 and 116 may affect the level of the supply voltage that is delivered to each memory card 104. For example, the supply voltage received at memory card 104A may be different from the supply voltage received at memory card 104F, due to power loss attributable to various parasitic elements 116.

In order to compensate for such variance, a sense line 120A may be coupled to a point of trace 108A, and a sense line 120B may be coupled to a point of trace 108B to differentially sense the supply voltage. The sense lines 120A and 120B may include respective resistors 128A and 128B to improve the accuracy of the sense lines. Voltage levels sensed at the points of intersection between the sense lines and traces 108 may be fed back as a differential pair to the voltage regulator 106 to adjust the level of the supply voltage. For example, the sensed differential voltage value may be supplied to operational amplifier 122. The output of the operational amplifier may then be compared against a reference voltage ($V_{REF}$) by another operational amplifier 124. The difference between $V_{REF}$ and the sensed voltage may be used to adjust the level of the supply voltage output by a voltage generator 126. Various embodiments contemplate any suitable circuitry for generating an output voltage and adjusting the output voltage based on feedback comprising one or more sensed values of the output voltage.

In the architecture of FIG. 1, the voltage regulator 106 is shared across multiple memory cards 104. The centralized remote sense nodes on the circuit board 102 (e.g., near memory card 104E at the termination of the sense lines 120A and 120B) may prevent accurate output voltage regulation at the actual points of loading (e.g., the actual points of loading may be located on the memory devices 104). Such a system may fail to compensate for load variation induced by different memory card memory capacities, memory process variations, and power efficiencies. Moreover, memory card connector contact resistance loss and printed circuit board (PCB) power distribution variation may not be accurately compensated and scaled. System distribution loss (e.g., due to the parasitic elements 114 and 116) may be a significant part of the voltage tolerance budget for memory devices of memory cards 104, which may be, e.g., +/−5% of the power supply for the memory card I/O and other circuits. In some systems, the host platform (i.e., circuit board 102 and components thereon) may overcompensate the output voltage by a fixed value, based on a predetermined loading. This can lead to system over-design, resulting in increased cost or reduced performance.

Various embodiments of the present disclosure provide an improved power distribution scheme with remote voltage feedback to improve direct current (DC) regulation across various loading scenarios. Particular embodiments optimize voltage regulator output regulation dynamically by accurately sensing a voltage level at the point of load (e.g., at a point on a memory card 104). Various embodiments provide differential voltage sense nodes on each memory card. These remote sense nodes may each be coupled to a common node (e.g., a point on the sense lines 120A and 120B) on the host platform (e.g., circuit board 102), such that the voltage regulator 106 may track and adjust the voltage based on the actual memory loading scenarios. Various embodiments may sense a differential voltage between a power plane and a ground plane of each memory card 104. In particular embodiments, each memory card 104 may comprise dedicated connector pins to communicate the sensed differential output voltage.

Figure 2:
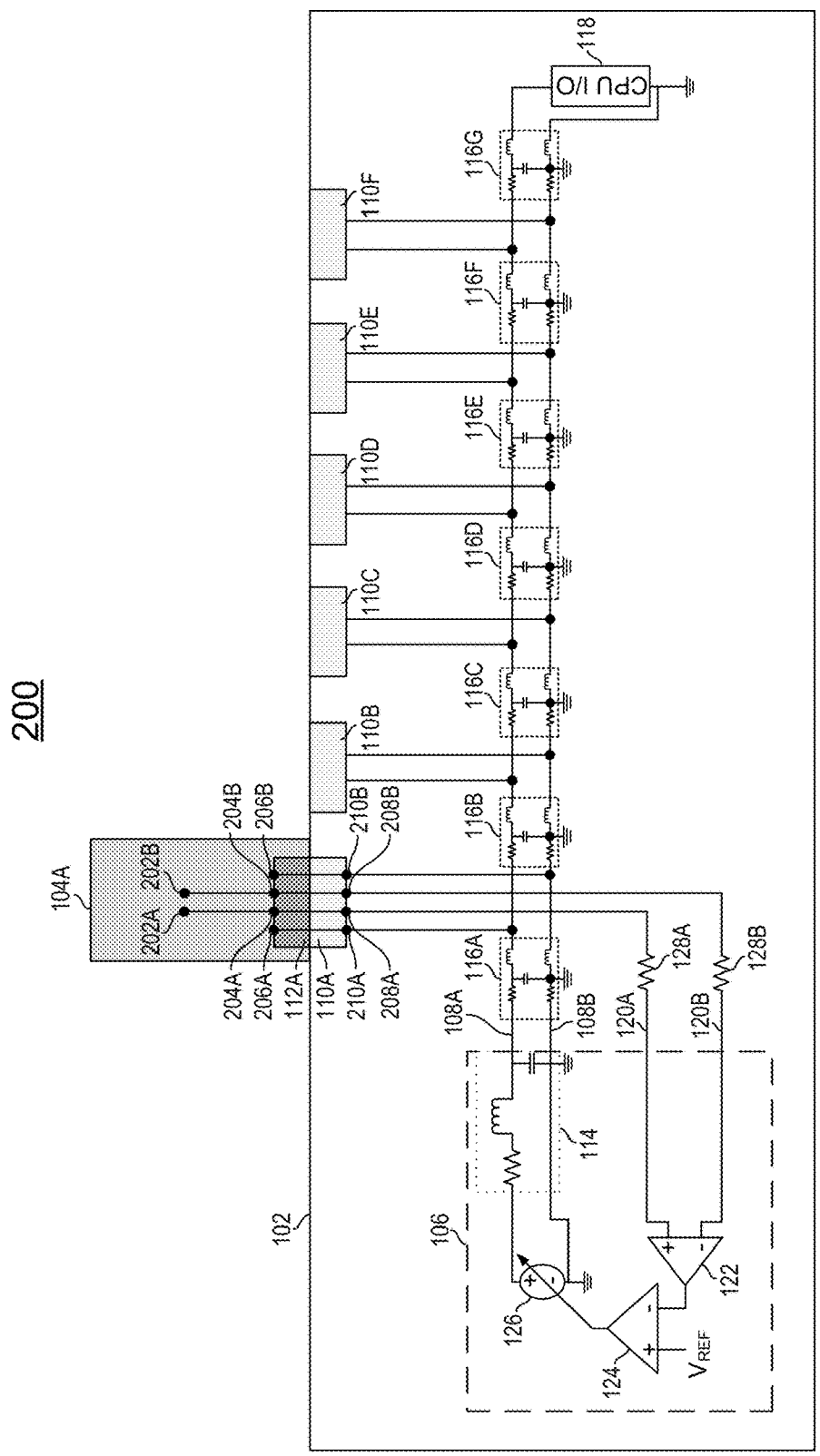
FIG. 2 depicts an example computing system with a memory card having remote sense nodes for supply voltage feedback in accordance with various embodiments.

FIG. 2 depicts an example computing system 200 with a memory card 104A having remote sense nodes 202A and 202B for supply voltage feedback in accordance with various embodiments. In this embodiment, a single memory card 104A is coupled to the circuit board 102. Sense line 120A is coupled to remote sense node 202A via a sense pin 204A of the card connector 112A and a sense pin 208A of the board connector 110A. Similarly, sense line 120B is coupled to remote sense node 202B via a sense pin 204B of the card connector 112A and a sense pin 208B of the board connector 110A. In an embodiment, sense node 202A may be coupled to a power plane (or other suitable portion) of memory card 104A that is coupled to the positive terminal of the voltage regulator 106 via voltage supply pin 206A of the card connector 112A, which is coupled to a corresponding voltage supply pin 210A of the board connector 110A. In alternative embodiments, multiple voltage supply pins may couple the positive terminal of the voltage regulator 106 to the power plane of memory card 104A. Similarly, sense node 202B may be coupled to a ground plane (or other portion) of memory card 104A that is coupled to the negative terminal (e.g., ground terminal) of the voltage regulator 106 via ground pin 206B of the card connector 112A, which is coupled to a corresponding ground pin 210B of board connector 110A. In alternative embodiments, multiple ground pins may couple the negative terminal of the voltage regulator 106 to the ground plane of memory card 104A.

The sense nodes 202A and 202B may provide a differential sense voltage that is fed back to the voltage regulator 106 via and then compared against a reference voltage ($V_{REF}$) to adjust the output of voltage generator 126 (e.g., by adjusting a duty cycle of a pulse width modulator of the voltage generator or via other suitable method for adjusting the voltage output). Because the sense nodes 202A and 202B are located much closer to the actual load on the supply voltage, they provide more accurate feedback than sense nodes located on the circuit board 102. The voltage regulator 106 uses the sensed values to adjust the output of the voltage regulator to compensate for transmission losses (e.g., the output of the voltage regulator 106 may be adjusted to cause the sensed voltage at the memory card 104A to move towards an output voltage of the voltage regulator 106 that provides, after transmission losses are taken into account, supply of a nominal voltage (e.g., $V_{REF}$ or a derivative thereof) to the memory card 104A, where the nominal voltage is the desired voltage to be provided to the memory card 104A). In various embodiments, the nominal voltage (e.g., $V_{REF}$) may be set based on any known voltage drops from the sense nodes 202A and 202B (e.g., through the connectors) back to the voltage regulator 106 to more accurately generate the desired output voltage (e.g., it may be assumed that the sensed voltage at the memory card 104A is slightly higher than the differential voltage received at the voltage regulator 106 since transmission losses may occur on the path back to the voltage regulator 106).

In the embodiment depicted, a dedicated sense pin 204B of card connector 112A is used to carry the signal from the sense node 202B (which may be coupled to the ground plane or other portion of memory card 104A coupled to ground at a particular location of the memory card 104A), and sense line 120B is coupled to the dedicated sense pin 204B via sense pin 208B of the board connector 110A. In an alternative embodiment, the sense line 120B may instead be coupled to pin 210B of the board connector 110A and to the pin 206B of the card connector 112A to provide an approximation of a ground signal received at the memory card 104A. Thus, the sense line 120B may simply be connected to one or more ground pins (e.g., 210B) that couple the ground of the circuit board 102 to the ground of the memory card 104A.

Figure 3:
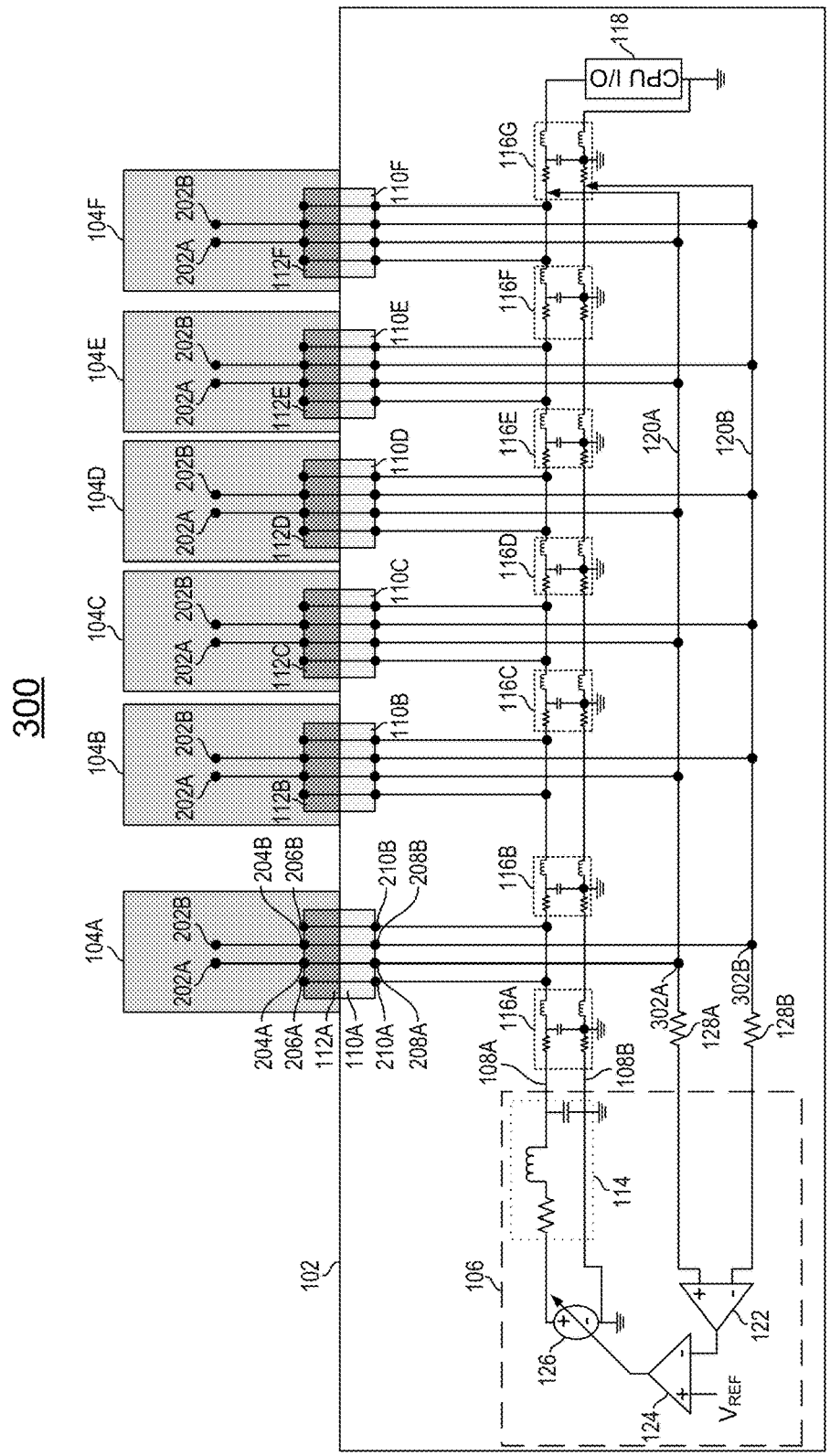
FIG. 3 depicts an example computing system with a plurality of memory cards that each have remote sense nodes and for supply voltage feedback in accordance with various embodiments.

FIG. 3 depicts an example computing system 300 with a plurality of memory cards 104 that each have remote sense nodes 202A and 202B for supply voltage feedback in accordance with various embodiments. In this embodiment, a plurality of memory cards 104 are coupled to the circuit board 102 via connectors 110 and 112. In this embodiment, sense line 120A is coupled to each of the remote sense nodes 202A via respective sense pins 208A and 204A, and sense line 120B is coupled to each of the remote sense nodes 202B via respective sense pins 208B and 204B. For example, a particular memory card 104 may include one of the sense nodes 202A and one of the sense nodes 202B, while another memory card 104 includes a different one of the sense nodes 202A and a different one of the sense nodes 202B. In an alternative embodiment, the sense line 120B may be coupled to a ground pin 206B of each memory card 104 (via respective ground pins 210B), in which case each sense node 202B is essentially located at the respective sense pin 206B. In the embodiment depicted, the sense nodes 202A are each coupled to a common point 302A on the circuit board 102 while each of the sense nodes 202B are each coupled to a common point 302B on the circuit board 102. These common points are coupled to the voltage regulator 106, which uses the voltage differential between pints 302A and 302B to adjust the output of the voltage regulator 106.

By coupling the sense nodes 202A and 202B together respectively in this manner, the supply voltage output by the voltage regulator 106 and provided to each memory card 104 may be set to a value that is more likely to stay within the required voltage tolerances of the memory cards 104. In a particular embodiment, the averaged value of the sensed nodes at common points 302A and 302B is equal to SQRT [((Vload1)^2+(Vload2)^2+ . . . (VloadN)^2)/N], where Vload1 is the differential voltage between sense node 202A and 202B of memory card 104A, Vload2 is the differential voltage between sense node 202A and 202B of memory card 104B, Vload3 is the differential voltage between sense node 202A and 202B of memory card 104C, and so on, and N is the number of sensed voltages (e.g., the number of memory cards 104). This value, also known as the root mean square value of the sensed differential voltages, is provided to the voltage regulator 106 to adjust the supply voltage output by the voltage regulator.

Figure 4:
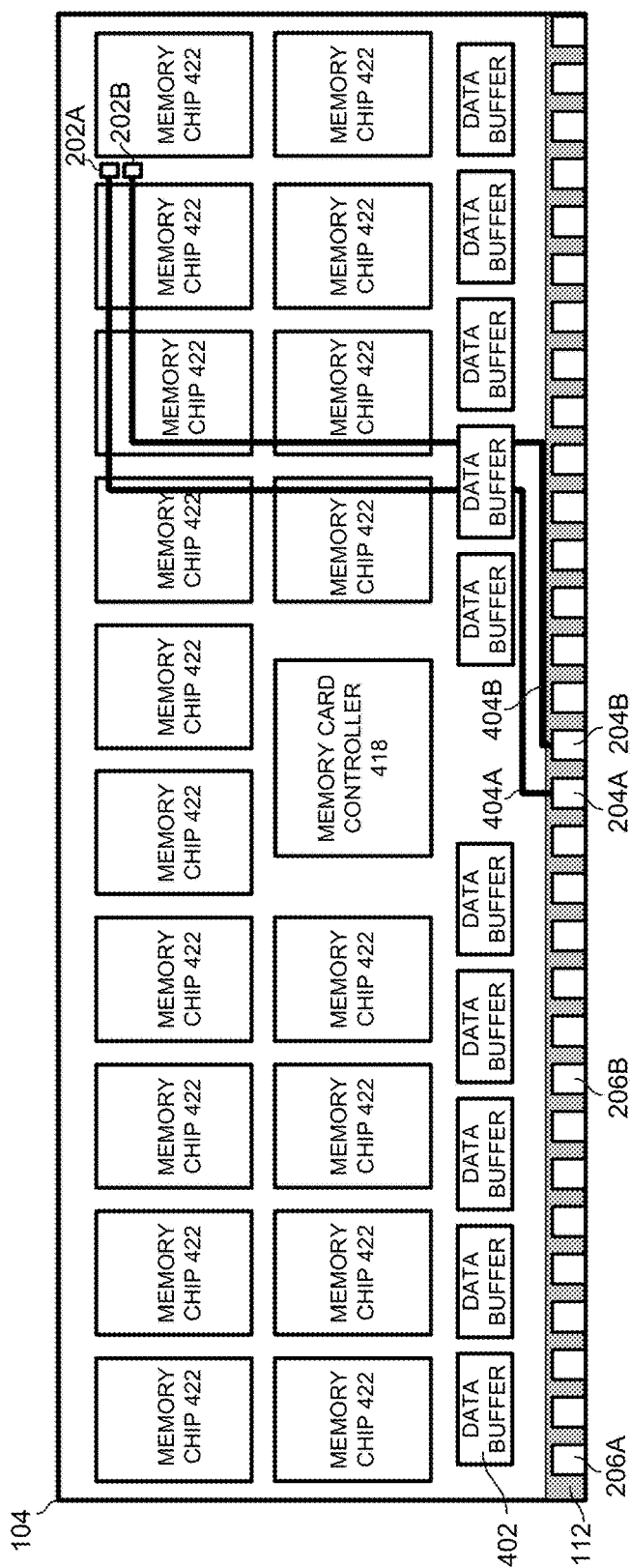
FIG. 4 depicts an example memory card in an unbalanced power feed topology in accordance with certain embodiments.

FIG. 4 depicts an example memory card 104 in an unbalanced power feed topology in accordance with certain embodiments. The memory card 104 includes a plurality of data buffers 402, a memory card controller 418, and a plurality of memory chips 422. The memory card 104 also includes a plurality of pins on a card connector 112. For example, the memory card may include voltage supply pin 206A configured to couple to the positive terminal of the voltage regulator 106 (this pin is sometimes referred to as a VDD pin). In the embodiment depicted, pin 206A is coupled proximate to an edge of the card connector 112, though in other embodiments, pin 206A may be placed at any suitable location of card connector 112. The memory card 104 may also include a ground pin 206B configured to couple to the negative terminal of the voltage regulator 106. In various embodiments, card connector 112 may include any number of voltage pins that are each coupled to the positive terminal of the voltage regulator 106 via one or more traces 108A and any number of ground pins that are each coupled to the negative terminal of the voltage regulator 106 via one or more traces 108B. The differential supply voltage from the voltage regulator 106 may be provided to memory card 104 through pins 206A and 206B. Voltage supply pin 206A and ground pin 206B may be coupled to a voltage supply network of the memory card 104 that distributes the supply voltage to various components of the memory card. As one example, voltage supply pin 206A may be coupled to a power plane that spans across the memory card 104 at a particular layer of the memory card and ground pin 206B may be coupled to a ground plane that spans across the memory card 104 at a different layer of the memory card. The power plane and the ground plane may distribute the power supply to the data buffers 402, the memory card controller 418, the memory chips 422, and/or other circuitry. In various embodiments, multiple power planes and/or ground planes may be used or other topologies may be used for the power distribution network.

Memory card 104 also includes sense pin 204A and sense pin 204B. The sense pin 204A is coupled via a trace 404A to a sense node 202A of the memory card 104 and the sense pin 204B is coupled via a trace 404B to a sense node 202B of the memory card 104. In some embodiments, traces 404 may be a conductive trace on a printed circuit board. Sense node 202A may be coupled to a power plane (or other point of the voltage distribution network that is electrically coupled to voltage supply pin 206A) while sense node 202B may be coupled to a ground plane (or other point of the voltage distribution network that is electrically coupled to ground pin 206B). In various embodiments, sense node 202A or 202B may be respectively coupled to the power plane and ground plane (or other portions of the power distribution network) through vias that each connect a layer of the memory card to another layer of the memory card.

In various embodiments, sense node 202A may be coupled to the actual supply voltage (i.e., the voltage received via voltage supply pin 206A) or to a derivative thereof. In some embodiments, the main supply voltage received from voltage supply pin (sometimes termed $V_{DD}$) may be provided to the core of the memory card 104 (e.g., to the memory arrays within each memory chip) while a secondary supply voltage (sometimes termed $V_{DDQ}$) that is derived from the main supply voltage is supplied to I/O circuitry (e.g., I/O driver, pre-driver, clocking circuitry) of the memory card 104. A sense node 202A may be coupled to either the main supply voltage or the derivative supply voltage.

The embodiment depicted in FIG. 4 shows an unbalanced power feed topology, where a single voltage supply pin 206A on one side of the connector 112 couples to the positive terminal of the voltage regulator 106 (multiple voltage supply pins 206A may also result in an unbalanced power feed topology if they are not evenly distributed). In order to get an accurate sensing of the load on the supply voltage, the sense nodes are placed at a location that is relatively far from the pin 206A, such that voltage drops between the pin 206A and the sense node 202A are taken into account in the feedback provided to the voltage regulator 106.

Figure 5:
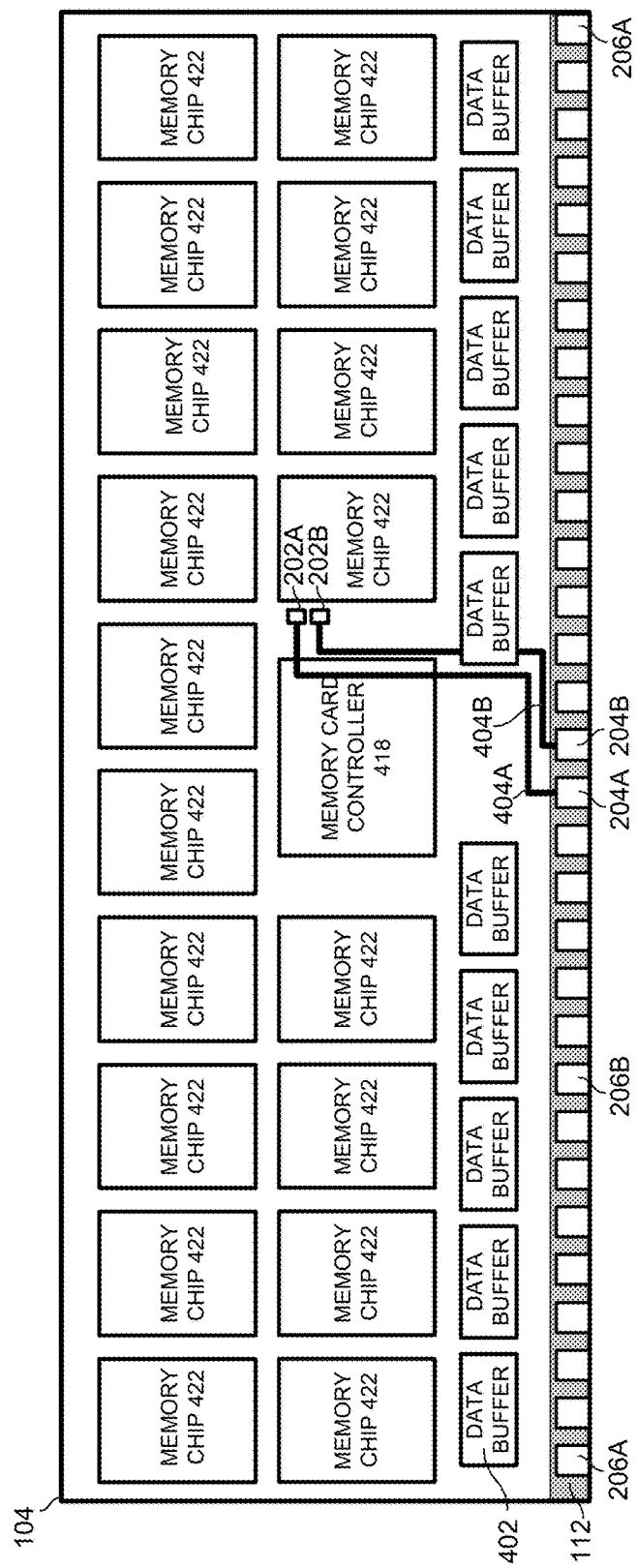
FIG. 5 depicts an example memory card in a balanced power feed topology in accordance with certain embodiments.

FIG. 5 depicts a memory card 104 in a balanced power feed topology in accordance with certain embodiments. The depicted embodiment shows a balanced power feed topology, where two voltage supply pins 206A (one on each side of connector 112) couple to the positive terminal of the voltage regulator 106. In this embodiment, the sense nodes 202A and 202B are placed at a central location of memory card 104 (e.g., proximate memory card controller 418).

In various embodiments, the sense nodes 202A and 202B may be placed at any suitable location of memory card 104. For example, the sense nodes may be placed proximate a voltage supply pin 206A, proximate a ground pin 206B (in some embodiments sense node 202B may be the sense pin 204B itself which may be coupled to ground, thus a pin that is normally used to couple the ground of the circuit board 102 to the ground of the memory card 104 via trace 108B may be repurposed as a sense pin 204B), in between two voltage supply pins (e.g., as depicted in FIG. 5), in between a voltage supply pin and a ground supply pin, proximate one or more memory chips 422 (e.g., proximate a memory chip that is the furthest from a positive supply pin 206A), proximate to a voltage supply pin of a package comprising a memory chip 122, proximate to a voltage supply pin of a package comprising a controller of the memory card, proximate the sense pin for the sense node (e.g., sense node 202A may be placed next to pin 204A), within a memory chip 122, or at any other suitable location.

In the embodiments depicted, the sense nodes 202A and 202B are placed proximate each other and their corresponding traces may run next to each other on the memory card 104. In other embodiments, the sense nodes 202A and 202B may be placed at different locations of the memory card 104.

Figure 6:
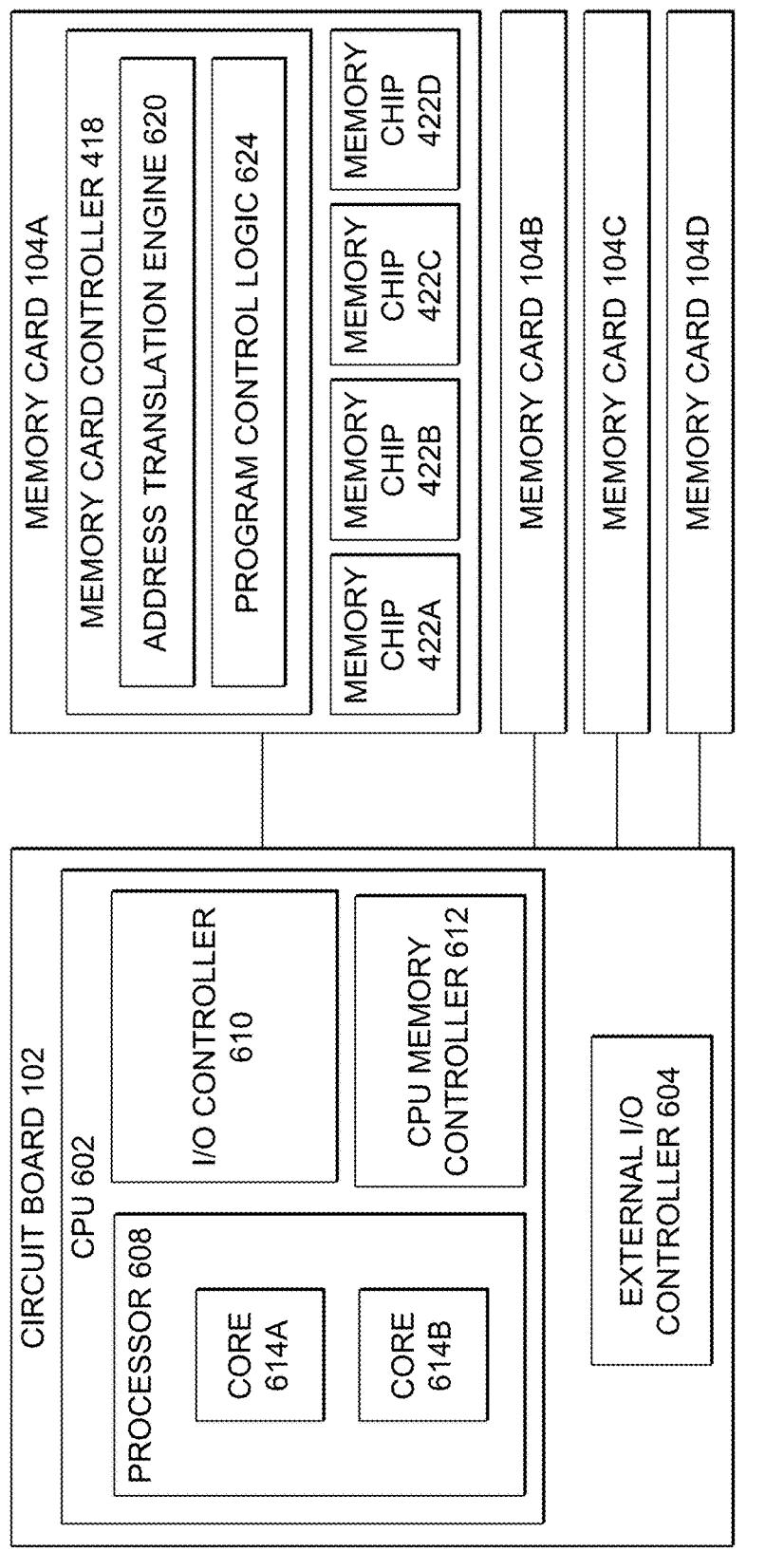
FIG. 6 depicts an example computing system with multiple memory cards in accordance with various embodiments.

FIG. 6 illustrates a block diagram of components of a computer system 600 in accordance with certain embodiments. System 600 includes a circuit board 102 comprising a central processing unit (CPU) 602 coupled to an external input/output (I/O) controller 604. The CPU 602 is also coupled to a plurality of memory cards 104 (i.e., 104A-104D). During operation, data may be transferred between CPU 602 and memory cards 104. In various embodiments, particular data operations (e.g., read and write operations) involving a memory card 104 may be managed by an operating system or other software application executed by processor 608.

CPU 602 comprises a processor 608, such as a microprocessor, an embedded processor, a digital signal processor (DSP), a network processor, a handheld processor, an application processor, a co-processor, a system on a chip (SOC), or other device to execute code (i.e., software instructions). Processor 608, in the depicted embodiment, includes two processing elements (cores 614A and 614B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 614 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 610 is an integrated I/O controller that includes logic for communicating data between CPU 602 and I/O devices, which may refer to any suitable devices capable of transferring data to and/or receiving data from an electronic system, such as CPU 602. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device that may be coupled to the CPU 602 through I/O controller 610.

An I/O device may communicate with the I/O controller 610 of the CPU 602 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 610 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 602) or may be integrated on the same chip as the CPU 602.

CPU memory controller 612 is an integrated memory controller that includes logic to control the flow of data going to and from one or more system memory devices, such as memory cards 104. CPU memory controller 612 may include logic operable to read from a system memory device, write to a system memory device, or to request other operations from a system memory device. In various embodiments, CPU memory controller 612 may receive write requests from cores 614 and/or I/O controller 610 and may provide data specified in these requests to a system memory device for storage therein. CPU memory controller 612 may also read data from a system memory device and provide the read data to I/O controller 610 or a core 614. During operation, CPU memory controller 612 may issue commands including one or more addresses of the system memory device in order to read data from or write data to memory (or to perform other operations). In some embodiments, CPU memory controller 612 may be implemented on the same chip as CPU 602, whereas in other embodiments, CPU memory controller 612 may be implemented on a different chip than that of CPU 602. I/O controller 610 may perform similar operations with respect to one or more storage devices.

The CPU 602 may also be coupled to one or more other I/O devices through external I/O controller 604. In a particular embodiment, external I/O controller 604 may couple a storage device to the CPU 602. External I/O controller 604 may include logic to manage the flow of data between one or more CPUs 602 and I/O devices. In particular embodiments, external I/O controller 604 is located on a motherboard along with the CPU 602. The external I/O controller 604 may exchange information with components of CPU 602 using point-to-point or other interfaces.

A system memory device (in some embodiments memory card 104 may function as a system memory device) may store any suitable data, such as data used by processor 608 to provide the functionality of computer system 600. For example, data associated with programs that are executed or files accessed by cores 614 may be stored in a system memory device. Thus, a system memory device may include a system memory that stores data and/or sequences of instructions that are executed or otherwise used by the cores 614. In various embodiments, a system memory device may store volatile persistent data (e.g., a user's files or instruction sequences) that remains stored even after power to the system memory device is removed or non-persistent data that is lost when power is removed. A system memory device may be dedicated to a particular CPU 602 or shared with other devices (e.g., one or more other processors or other device) of computer system 600.

In various embodiments, a memory card 104 may include a memory comprising any number of memory arrays on any number of memory chips 422, a memory card controller 418, and other supporting logic (not shown). A memory array may include non-volatile memory and/or volatile memory.

Non-volatile memory is a storage medium that does not require power to maintain the state of data stored by the medium. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, memory that uses chalcogenide phase change material (e.g., chalcogenide glass), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium. Nonlimiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

In a particular embodiment, a memory chips 422 may each be embodied within a semiconductor package coupled to a circuit board of a memory card 104. In various embodiments, a semiconductor package may comprise a casing comprising one or more semiconductor dies (also referred to as chips). A package may also comprise contact pins or leads used to connect to external circuits.

A memory card 104 may comprise any suitable type of memory and is not limited to a particular speed, technology, or form factor of memory in various embodiments. For example, a memory card 104 may be a memory module (e.g., a DIMM, a single in-line memory module (SIMM), etc.) that may be inserted in a socket, a flash drive, a disk drive, or other type of storage device.

In a particular embodiment, memory card 104 has a DIMM form factor. A DIMM may include multiple memory chips 422 mounted on a circuit board, wherein the circuit board includes electrical contacts (i.e., pins) on each side of the circuit board. In various examples, the memory card 104 may have any suitable number of pins, such as 288, 260, 244, 240, 204, 200, or other suitable number of pins. In various embodiments, memory card 104 may be inserted into a DIMM slot on circuit board 102 (e.g., a motherboard) that also comprises a socket for CPU 602. In a particular embodiment, memory card 104 is a non-volatile DIMM (NV-DIMM) in which the memory chips 422 include non-volatile memory. In another embodiment, memory card 104 is a DIMM in which the memory chips 422 include volatile memory (e.g., DRAM).

Memory card controller 418 may include logic to receive requests from CPU 602 (e.g., via CPU memory controller 612 or I/O controller 610), cause the requests to be carried out with respect to memory chips 422, and provide data associated with the requests to CPU 602 (e.g., via CPU memory controller 612 or I/O controller 610). Controller 418 may also be operable to detect and/or correct errors encountered during memory operation. In various embodiments, controller 118 may also monitor various characteristics of the memory card 104 such as the temperature or voltage and report associated statistics to the CPU 602.

In various embodiments, the memory card 104 may also include an address translation engine 620. In various embodiments, the address translation engine 620 may be integrated on the same chip or package as the storage device controller 118 or on a different chip or package. Address translation engine 620 may include logic to translate between a logical address space (e.g., an address space visible to a host computing device coupled to the memory card 104) and the physical address space of the memory of the memory card 104.

In various embodiments, the controller 418 also includes program control logic 624 which is operable to control the programming sequence performed when data is written to a memory chip 422 or the read sequence performed when data is read from a memory chip 422.

In some embodiments, all or some of the elements of system 600 are resident on (or coupled to) the same circuit board (e.g., a motherboard). In various embodiments, any suitable partitioning between the elements may exist. For example, the elements depicted in CPU 602 may be located on a single die (i.e., on-chip) or package or any of the elements of CPU 602 may be located off-chip or off-package. Similarly, the elements depicted in memory card 104 may be located on a single chip or on multiple chips.

The components of system 600 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 600, such as cores 614, one or more CPU memory controllers 612, I/O controller 610, integrated I/O devices, direct memory access (DMA) logic (not shown), etc. In various embodiments, components of computer system 600 may be coupled together through one or more networks comprising any number of intervening network nodes, such as routers, switches, or other computing devices. For example, a host computing device (e.g., CPU 602) and a storage device may be communicably coupled through a network.

Although not depicted, system 600 may use a battery and/or power supply outlet connector and associated system to receive power, a display to output data provided by CPU 602, or a network interface allowing the CPU 602 to communicate over a network. In various embodiments, the battery, power supply outlet connector, display, and/or network interface may be communicatively coupled to CPU 602. Other sources of power can be used such as renewable energy (e.g., solar power or motion based power).

Figure 7:
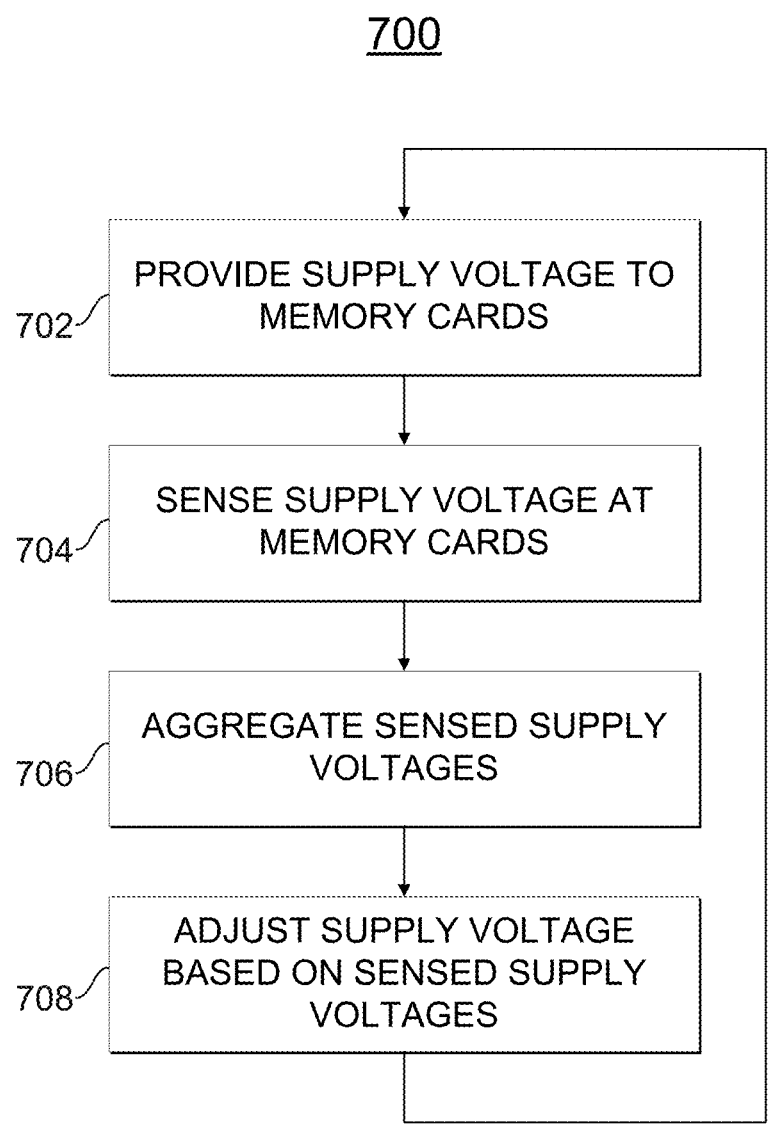
FIG. 7 depicts an example flow for adjusting a supply voltage based on voltage sensed by remote sense nodes of memory cards in accordance with various embodiments.

FIG. 7 depicts an example flow for adjusting a supply voltage based on voltage sensed by remote sense nodes of memory cards in accordance with various embodiments. At 702, a supply voltage is provided to a plurality of memory cards. For example, a voltage regulator on a chip of a semiconductor package coupled to a circuit board may provide the supply voltage to a plurality of memory cards plugged into sockets of the circuit board.

At 704, the supply voltage is sensed by at least some of the memory cards (e.g., memory cards having remote sense nodes may sense the supply voltage). The sensed supply voltages are fed back to a point on the circuit board and aggregated at 706. For example, one or more traces carrying the supply voltage may converge at a point on the circuit board. At 708, the supply voltage is adjusted based on the sensed supply voltages. The flow then returns to 702, where the adjusted supply voltage is provided to the memory cards.

The flow described in FIG. 7 is merely representative of operations that may occur in particular embodiments. In other embodiments, additional operations may be performed by any components referenced herein. Various embodiments of the present disclosure contemplate any suitable signaling mechanisms for accomplishing the functions described herein. Some of the operations illustrated in FIG. 7 may be repeated, combined, modified or deleted where appropriate. Additionally, operations may be performed in any suitable order (including simultaneously) without departing from the scope of particular embodiments.

The teachings of the present disclosure may be applicable to any memory or storage device form factor or other computing device form factor (e.g., a graphics card) that may receive a power supply from a central source (e.g., a voltage regulator on a circuit board) and provide feedback to adjust the power supply. In various embodiments, one or more sense nodes described herein may be placed on any suitable memory or storage device or other suitable computing device.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any functionality of the various components such as memory cards 104, CPU 602, external I/O controller 604, processor 608, cores 614A and 614B, I/O controller 610, CPU memory controller 612, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprises a first connector to couple to a connector of a memory card, the memory card comprising a first sense node to sense a supply voltage at a first location of the memory card, the first connector comprising a voltage supply pin;

a ground pin; and a sense pin to couple to the first sense node; a first sense line to couple to the first sense node through the sense pin; and a voltage regulator coupled to the first sense line, the voltage regulator to provide the supply voltage based on feedback received from the first sense node of the memory card via the first sense line.

In an embodiment, a second sense line is to couple to a second sense node of the memory card through a second sense pin of the first connector; wherein the voltage regulator is to couple to the second sense line and is to output the supply voltage based on a voltage difference between the first sense node of the memory card and the second sense node of the memory card. In an embodiment, a second sense line is to couple to the ground pin, wherein the voltage regulator is to couple to the second sense line and is to output the supply voltage based on a voltage difference between the first sense node of the memory card and the ground pin. In an embodiment, a second connector is to couple to a connector of a second memory card, the second memory card comprising a first sense node is to sense the supply voltage at a first location of the second memory card; wherein the first sense line is to couple to the first sense node of the second memory card through a sense pin of the second connector and the voltage regulator is to output the supply voltage further based on feedback received from the first sense node of the second memory card via the first sense line. In an embodiment, an apparatus further comprises a central processing unit, wherein the memory card is a system memory device for the central processing unit. In an embodiment, the first connector is a dual in-line memory module (DIMM) socket. In an embodiment, the voltage regulator is to adjust a duty cycle of a pulse width modulator of the voltage regulator based on feedback received from the first sense node of the memory card via the first sense line.

In at least one embodiment, a memory card comprises a plurality of connection pins, the plurality of connection pins comprising a voltage supply pin, a ground pin, and a first sense pin, the plurality of connection pins to mate with pins of a connector of a circuit board; a plurality of memory chips comprising a plurality of memory arrays, the voltage supply pin and the ground pin to provide a supply voltage to the plurality of memory chips when the memory card is coupled to the connector of the circuit board; and a first voltage sense node to sense the supply voltage at a first location of the memory card, the first voltage sense node to provide feedback through the first sense pin to a voltage regulator of the circuit board that is to provide the supply voltage when the memory card is coupled to the connector.

In an embodiment, a memory card further comprises a second voltage sense node to sense the supply voltage at a second location of the memory card, the second voltage sense node to provide feedback through a second sense pin of the plurality of connection pins to the voltage regulator of the circuit board when the memory card is coupled to the connector. In an embodiment, the second voltage sense node is coupled to a ground plane of the memory card. In an embodiment, the first voltage sense node is coupled to a power plane of the memory card. In an embodiment, the first voltage sense node is proximate to a voltage supply pin of a package comprising a memory chip of the plurality of memory chips. In an embodiment, the first voltage sense node is proximate to a voltage supply pin of a package comprising a controller of the memory card.

In at least one embodiment, a system comprises a circuit board; a memory card to couple to the circuit board, the memory card comprising a first voltage sense node coupled to a first pin of the memory card and a second voltage sense node coupled to second pin of the memory card; and a voltage regulator to couple to the circuit board, the voltage regulator to adjust a supply voltage to be provided to the memory card based on a differential voltage between the first voltage sense node and the second voltage sense node.

In an embodiment, a system further comprises a plurality of memory cards that each include a first voltage sense node and a second voltage sense node, wherein the voltage regulator is to adjust the supply voltage based on a differential voltage between a first node of the circuit board and a second node of the circuit board, wherein the first node of the circuit board is to be coupled to each first voltage sense node of the memory cards and the second node of the circuit board is to be coupled to each second voltage sense node of the memory cards. In an embodiment, the memory card comprises a dual in-line memory module (DIMM). In an embodiment, the first voltage sense node and the second voltage sense node are proximate to a package comprising a memory chip of a plurality of memory chips. In an embodiment, the first voltage sense node and the second voltage sense node are proximate to a package comprising a controller of the memory card. In an embodiment, a system further comprises a processor to couple to the circuit board; and a battery to communicatively couple to the processor, a display to communicatively couple to the processor, or a network interface to communicatively couple to the processor.

In at least one embodiment, a method comprises supplying, by a voltage regulator coupled to a circuit board, a supply voltage to a first memory card coupled to the circuit board; sensing the supply voltage at the memory card; providing the sensed supply voltage to the voltage regulator; and adjusting, by the voltage regulator, the supply voltage based on the supply voltage sensed at the memory card.

In an embodiment, a method further comprises sensing the supply voltage at a plurality of memory cards coupled to the circuit board; and adjusting, by the voltage regulator, the supply voltage based on the sensed supply voltages at the plurality of memory cards. In an embodiment, a first plurality of sense nodes of the memory cards are coupled to a first sense line of the circuit board and a second plurality of sense nodes of the memory cards are coupled to a second sense line of the circuit board, wherein the voltage regular adjusts the supply voltage based on a voltage differential between the first sense line and the second sense line. In an embodiment, the memory card is a dual in-line memory module (DIMM). In an embodiment, sensing the supply voltage at the memory card comprises sensing a first sense node at a first location of the memory card and sensing a second sense node at a second location of the memory card.

In at least one embodiment, a system comprises means for providing a supply voltage to a first memory card coupled to a circuit board; means for sensing the supply voltage at the memory card; and means for adjusting the provided supply voltage based on the supply voltage sensed at the memory card.

In an embodiment, a system further comprising means for sensing the supply voltage at a plurality of memory cards coupled to the circuit board; and means for adjusting the supply voltage based on the sensed supply voltages at the plurality of memory cards. In an embodiment, a first plurality of sense nodes of the memory cards are coupled to a first sense line of the circuit board and a second plurality of sense nodes of the memory cards are coupled to a second sense line of the circuit board, wherein the means for adjusting the provided supply voltage adjusts the supply voltage based on a voltage differential between the first sense line and the second sense line. In an embodiment, the memory card is a dual in-line memory module (DIMM). In an embodiment, sensing the supply voltage at the memory card comprises sensing a first sense node at a first location of the memory card and sensing a second sense node at a second location of the memory card.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a first connector to couple to a connector of a memory card, the memory card comprising a first sense node to sense a supply voltage at a first location of the memory card, the first connector comprising:
a voltage supply pin;
a ground pin; and
a sense pin to couple to the first sense node;
a first sense line to couple to the first sense node through the sense pin; and
a voltage regulator coupled to the first sense line, the voltage regulator to provide the supply voltage based on feedback received from the first sense node of the memory card via the first sense line.

2. The apparatus of claim 1, the apparatus further comprising a second sense line to couple to a second sense node of the memory card through a second sense pin of the first connector;
wherein the voltage regulator is coupled to the second sense line and is to output the supply voltage based on a voltage difference between the first sense node of the memory card and the second sense node of the memory card.

3. The apparatus of claim 1, the apparatus further comprising a second sense line to couple to the ground pin, wherein the voltage regulator is coupled to the second sense line and is to output the supply voltage based on a voltage difference between the first sense node of the memory card and the ground pin.

4. The apparatus of claim 1, the apparatus further comprising a second connector to couple to a connector of a second memory card, the second memory card comprising a first sense node to sense the supply voltage at a first location of the second memory card;
wherein the first sense line is to couple to the first sense node of the second memory card through a sense pin of the second connector and the voltage regulator is to output the supply voltage further based on feedback received from the first sense node of the second memory card via the first sense line.

5. The apparatus of claim 1, further comprising a central processing unit and wherein the memory card is a system memory device for the central processing unit.

6. The apparatus of claim 1, wherein the first connector is a dual in-line memory module (DIMM) socket.

7. The apparatus of claim 1, wherein the voltage regulator is to adjust a duty cycle of a pulse width modulator of the voltage regulator based on feedback received from the first sense node of the memory card via the first sense line.

8. A system comprising:
a circuit board;
a memory card to couple to the circuit board, the memory card comprising a first voltage sense node coupled to a first pin of the memory card and a second voltage sense node coupled to a second pin of the memory card; and
a voltage regulator to couple to the circuit board, the voltage regulator to adjust a supply voltage to be provided to the memory card based on a differential voltage between the first voltage sense node and the second voltage sense node.

9. The system of claim 8, the system comprising a plurality of memory cards that each include a first voltage sense node and a second voltage sense node, wherein the voltage regulator is to adjust the supply voltage based on a differential voltage between a first node of the circuit board and a second node of the circuit board, wherein the first node of the circuit board is to be coupled to each first voltage sense node of the memory cards and the second node of the circuit board is to be coupled to each second voltage sense node of the memory cards.

10. The system of claim 8, wherein the memory card comprises a dual in-line memory module (DIMM).

11. The system of claim 8, wherein the first voltage sense node and the second voltage sense node are proximate to a package comprising a memory chip of a plurality of memory chips.

12. The system of claim 8, wherein the first voltage sense node and the second voltage sense node are proximate to a package comprising a controller of the memory card.

13. The system of claim 8, further comprising:
a processor to couple to the circuit board; and
a battery to communicatively couple to the processor, a display to communicatively couple to the processor, or a network interface to communicatively couple to the processor.

* * * * *